(12) United States Patent
Söll et al.

(10) Patent No.: US 12,199,116 B2
(45) Date of Patent: Jan. 14, 2025

(54) DIODE ARRAY, ARRANGEMENT, AND SYSTEM

(71) Applicant: OSRAM Opto Semiconductors GmbH, Regensburg (DE)

(72) Inventors: Christopher Söll, Zirndorf (DE); Jens Richter, Hemau (DE); Markus Kösler, Landshut (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 610 days.

(21) Appl. No.: 17/432,800

(22) PCT Filed: Feb. 20, 2020

(86) PCT No.: PCT/EP2020/054501
§ 371 (c)(1),
(2) Date: Aug. 20, 2021

(87) PCT Pub. No.: WO2020/169742
PCT Pub. Date: Aug. 27, 2020

(65) Prior Publication Data
US 2022/0130878 A1  Apr. 28, 2022

(30) Foreign Application Priority Data

Feb. 21, 2019  (DE) .................... 10 2019 104 446.4
Mar. 29, 2019  (DE) .................... 10 2019 108 243.9

(51) Int. Cl.
*H01L 27/146* (2006.01)
*H04N 25/70* (2023.01)

(52) U.S. Cl.
CPC .. *H01L 27/14612* (2013.01); *H01L 27/14636* (2013.01); *H04N 25/70* (2023.01)

(58) Field of Classification Search
None
See application file for complete search history.

(56) References Cited

U.S. PATENT DOCUMENTS

2009/0167676 A1   7/2009  Edwards et al.
2018/0182295 A1*  6/2018  Ahmed ............... G09G 3/3283

FOREIGN PATENT DOCUMENTS

DE         103 29 367 A1    10/2004
DE      10 2016 109 296 A1  11/2016

OTHER PUBLICATIONS

International Search Report issued for corresponding International Patent Application No. PCT/EP2020/054501 on May 7, 2020, along with an English translation.

(Continued)

*Primary Examiner* — Long Pham
(74) *Attorney, Agent, or Firm* — Hauptman Ham, LLP

(57) ABSTRACT

A diode array with at least two image elements. The diode array includes a distribution transistor as well as a feed line for receiving a reference current and a first supply terminal coupled to the distribution transistor for supplying the distribution transistor. A diode and an input transistor are provided for each image element, each of which is coupled to the diode for supplying the diode. The distribution transistor forms a distribution current mirror with the respective input transistor of at least two image elements.

3 Claims, 6 Drawing Sheets

(56) References Cited

OTHER PUBLICATIONS

Written Opinion issued for corresponding International Patent Application No. PCT/EP2020/054501 on May 7, 2020.
Li et al., "Novel Self-Configurable Current-Mirror Techniques for Reducing Current Imbalance in Parallel Light-Emitting Diode (LED) Strings", IEEE Transactions on Power Electronics, vol. 27, No. Apr. 2021, pp. 2153-2162.
Nair et al., "Design and Implementation of a Wireless Sensor Network based Efficient LED Lighting System", 2015 6th International Conference on Computing, Communication and Networking Technologies (ICCCNT), IEEE, Jul. 13, 2015, pp. 1-6.
Payne, "A Review of an Analog Layout Tool called HiPer DevGen", SemiWiki.com, Nov. 28, 2011, cited in the Specification.
Omar, "Automated Layout Synthesis Tool for Op-Amp", Universiti Putra Malaysia, cited in the Specification.

\* cited by examiner

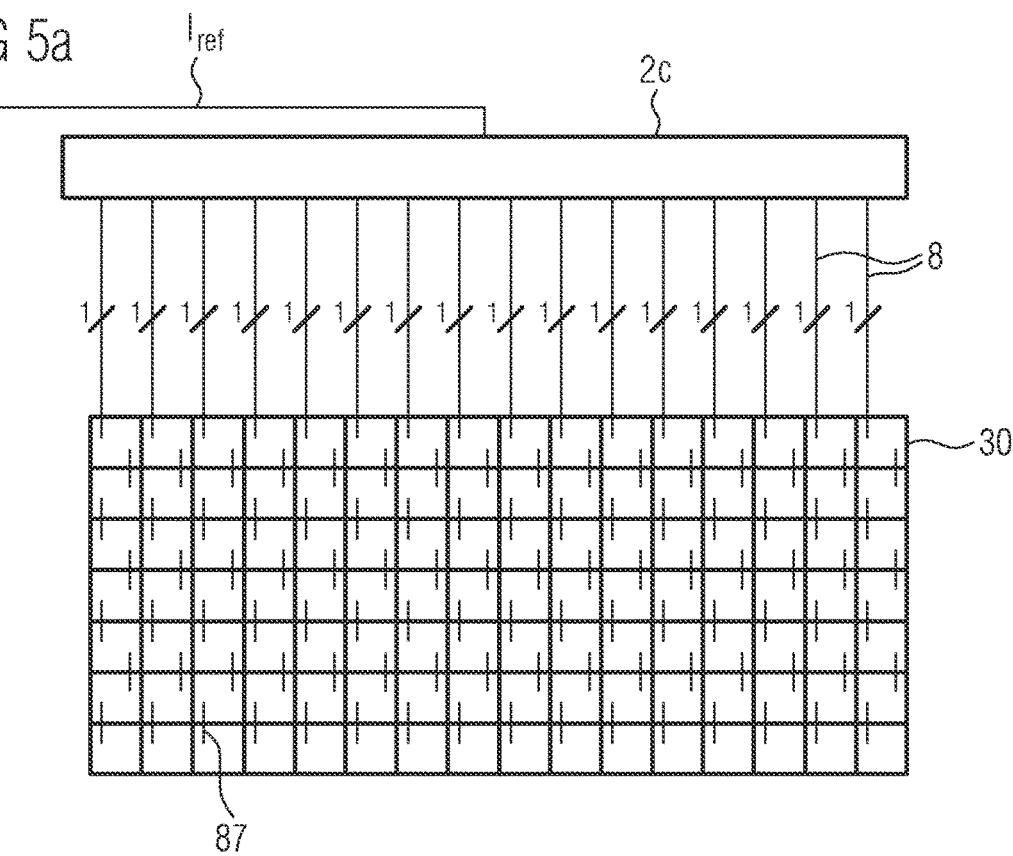
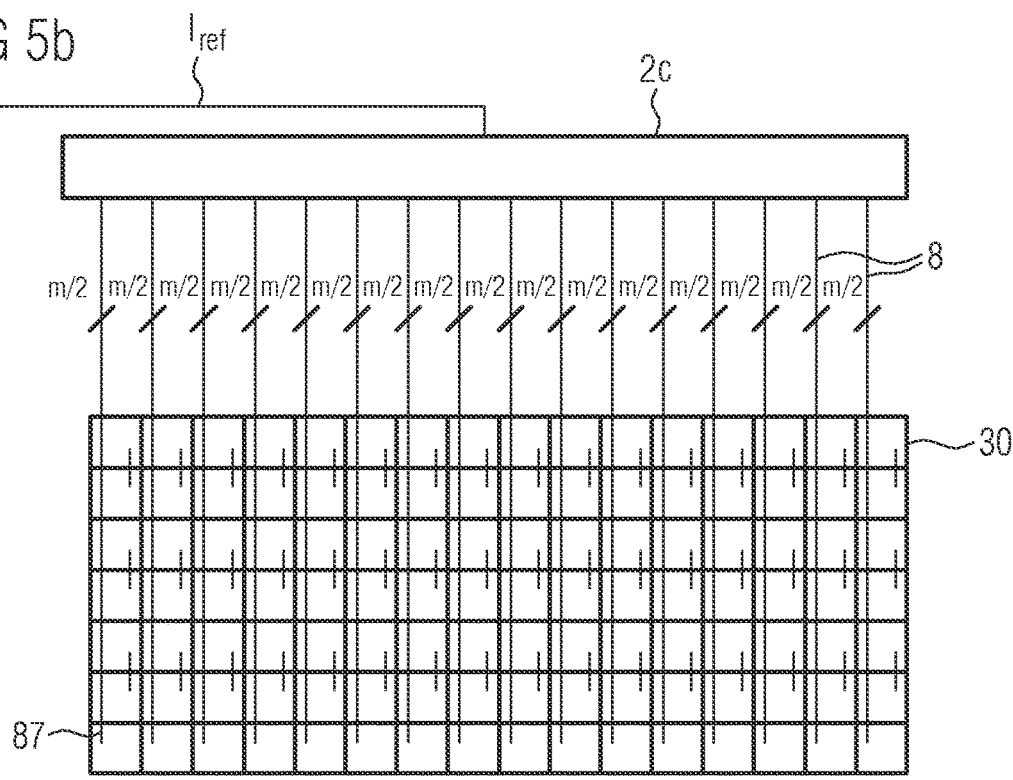

DIODE ARRAY, ARRANGEMENT, AND SYSTEM

CROSS REFERENCE TO RELATED APPLICATION

This application is a National Stage of International Application No. PCT/EP2020/054501, filed on Feb. 20, 2020, which designates the United States and was published in Europe, and which claims priority to German Patent Application Nos. 1) 10 2019 104 446.4, filed on Feb. 21, 2019; and 2) 10 2019 108 243.9, filed on Mar. 29, 2019 in the German Patent Office. Both of the aforementioned applications are hereby incorporated by reference in their entireties.

A diode array, an array having at least two consecutive diode arrays, and another diode array and a system are disclosed.

In large arrays, such as LED arrays or in image sensors, the supply of individual image elements ("pixel") with a reference voltage or a reference current (so-called "referencing") poses a problem, especially since the number of wiring lines may depend on the size of the array or the number of image elements, respectively.

An array 30 (cf. FIG. 1) usually comprises a plurality of image elements 5a, 5b arranged matrix-like in n columns and m rows.

In order to keep the number of wiring lines low, the individual image elements 5a, 5b can be supplied by means of a reference voltage $V_{ref}$ ("voltage referencing"). For this purpose, the array 30 can be arranged in a system 1' together with a reference voltage source 2a which has an output line 8 for each column of the array 30. The reference voltage source 2a is, by way of example, a stabilized precision voltage source such as a band gap reference.

However, such voltage referencing is subject to a variety of error sources that greatly affect the accuracy of the array.

Figure 2A:
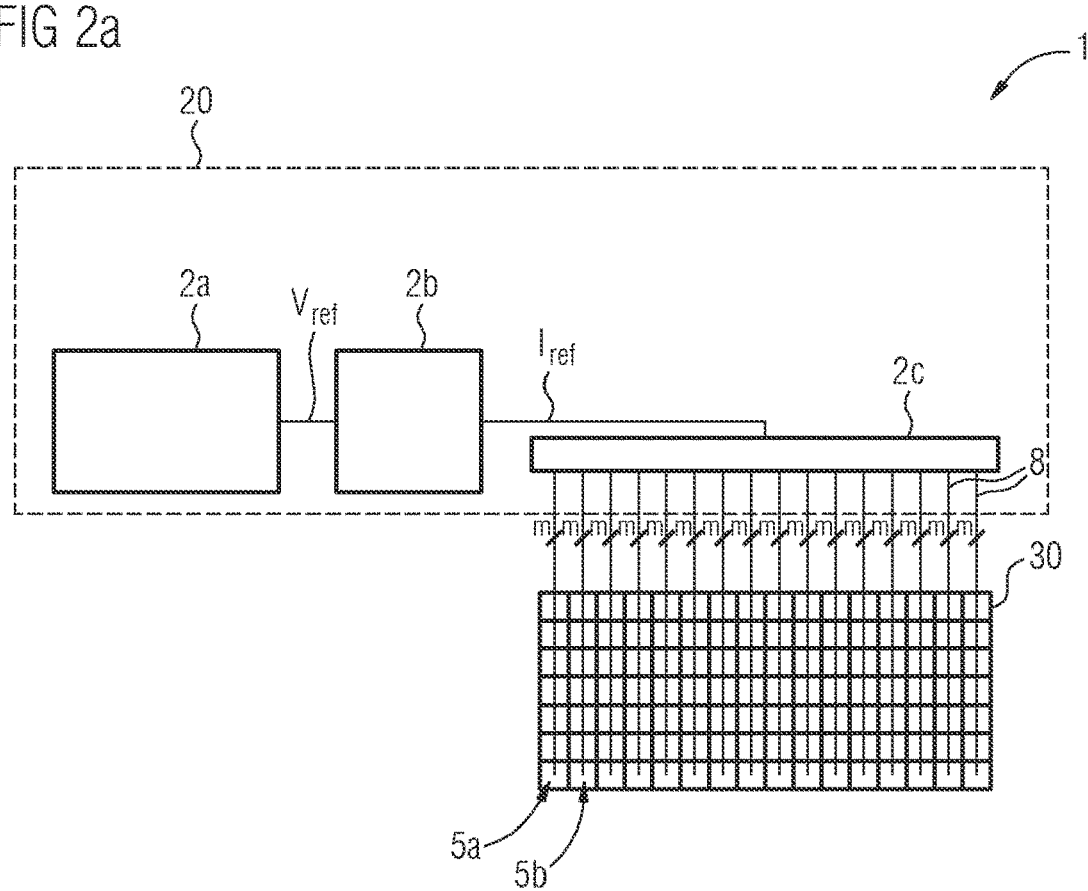

High-precision referencing is therefore preferably performed by current referencing (cf. FIG. 2a). For this purpose, the array 30 may be arranged in a system 1 together with a reference current source 20 which has an output line 8 for each image element of the array 30. For example, a voltage-current converter 2b is connected downstream of the reference voltage source 2a for this purpose, which converts the reference voltage $V_{ref}$ into a reference current $I_{ref}$. A current mirror bank 2c can be connected downstream of the voltage-to-current converter 2b to spread the reference current $I_{ref}$ over several output lines 8. For example, the current mirror bank 2c has 30 m output lines 8 per column. Alternatively, the current mirror bank 2c can be cascaded (cf. FIG. 2b). For example, the reference current $I_{ref}$ can initially be supplied by a current mirror bank 2c-1 to 4 current mirror banks 2c-2, which in turn pass the reference current $I_{ref}$ on to 12 current mirror banks 2c-2, each with 20 output lines 8. However, for large arrays 30 this results in a massive number of wiring lines.

It is therefore at least one object of the present invention to provide a diode array that enables highly accurate referencing of the image elements while helping to keep a wiring complexity low.

This object is solved by the subject-matter of the independent claims. Advantageous embodiments and further developments are indicated in the dependent claims and furthermore result from the following description and the drawings.

According to a first aspect of the invention, a diode array is disclosed.

In at least one embodiment according to the first aspect, the diode array comprises at least two image elements. In particular, the diode array may have a plurality of image elements, for example, 2, 4, 8, 16, 32, or 64. Exemplarily, the diode array is a subarray of a current-referenced array mentioned at the beginning, i.e., one or more diode arrays form such an array. In particular, the diode array is a composite of multiple diodes that are current referenced via a single feed line. In particular, the diode array and/or the array comprising one or more diode arrays is formed on a common wafer.

In at least one embodiment according to the first aspect, the diode array comprises a distribution transistor as well as a feed line for receiving a reference current and a first supply terminal. The feed line and the first supply terminal are thereby coupled to the distribution transistor for supplying the distribution transistor. In particular, the diode array has only one distribution transistor and only one feed line, regardless of the number of image elements. In particular, the distribution transistor is formed on a common wafer with the image elements. In particular, the distribution transistor is arranged in close proximity to the individual image elements of the diode array. Preferably, the distribution transistor is arranged between the image elements assigned to it or in their center, for example at a crossing point of rows and columns in the case of image elements arranged in a matrix-like manner. In an advantageous manner, the distribution transistor thus exhibits essentially the same temperature conditions as well as a low mismatch error with respect to the transistors installed in the respective image elements. The first supply connection is an exemplary ground connection. However, the first supply terminal can also be a supply voltage terminal; in particular, the diode array can be operated in a mirrored operating direction with opposite current direction, in which the described n-channel transistors are replaced by p-channel transistors and vice versa.

In at least one embodiment according to the first aspect, a diode and an input transistor are provided for each image element. The respective input transistor is coupled to the respective diode for supplying the corresponding diode. The diode is, by way of example, a photodiode or a light-emitting diode (LED). In particular, the input transistor is arranged in close proximity to the diode. Preferably, the input transistor is further arranged in close proximity to the corresponding distribution transistor of the diode array. In particular, the input transistor is formed on a common wafer with the corresponding distribution transistor. Advantageously, the input transistor thus exhibits essentially the same temperature conditions as well as an associated low mismatch error with respect to the distribution transistor.

In at least one embodiment according to the first aspect, the distribution transistor forms a distribution current mirror with the respective input transistor of at least two image elements. In particular, the distribution current mirror is a MOSFET current mirror. The formation of a current mirror is understood herein and hereinafter to be an interconnection of two transistors that enables mirroring or "copying" of the input current to an output of the current mirror.

In at least one embodiment according to the first aspect, a diode array having at least two image elements is disclosed, wherein the diode array comprises a distribution transistor as well as a feed line for receiving a reference current and a first supply terminal. The feed line and the first supply terminal are thereby coupled to the distribution transistor for supplying the distribution transistor. A diode and an input transistor are provided for each image element. The respective input transistor is coupled to the respective diode for supplying the corresponding diode. The distribution transistor forms a distribution current mirror with the respective input transistor of at least two image elements.

Advantageously, such a diode array can keep the number of feed lines for supplying the individual image elements low. In particular, the diode array enables precise referencing of arrays with a large number of image elements.

In at least one embodiment according to the first aspect, the distribution transistor has its drain electrode coupled to the supply terminal. Further, the distribution transistor has its source electrode coupled to the first supply terminal. Further, the distribution transistor has its control electrode coupled to its drain electrode to form a distribution terminal.

The respective input transistor is further coupled with its drain electrode to a first electrode of the diode. Furthermore, the respective input transistor is coupled with its source electrode to the first supply terminal. Further, the respective input transistor has its control electrode coupled to the distribution terminal.

A second electrode of the diode is furthermore coupled to a further supply terminal. If no further current mirror is connected upstream of the diode in addition to the distribution current mirror, the further supply terminal is in particular a second supply terminal with a different electrical potential from the first supply terminal, for example a supply voltage terminal ("high side diode"). If, on the other hand, a further current mirror is arranged between the diode and the distribution current mirror, the further supply connection in particular has an electrical potential identical to that of the first supply connection, or the further supply connection can then be the first supply connection.

A drain electrode is understood here and in the following as the drain terminal of a MOSFET. Analogously, the source electrode refers to a source terminal and the control electrode to a gate terminal of the MOSFET.

The fact that two or more components are coupled to each other includes here and in the following a direct or immediate electrical connection of the components as well as their indirect or indirect electrical connection. In particular, an additional supply current mirror can be connected downstream of the input transistor, via which the input transistor is electrically connected to the diode.

In at least one embodiment according to the first aspect, the distribution transistor forms a distribution current mirror with the respective input transistor of exactly 2 or 4 or 8 or 9 or 16 image elements.

Advantageously, this number is particularly suitable for the central arrangement of the distribution transistor, especially in the case of image elements arranged in a matrix-like manner, so that, for example, a mismatch error can be kept low.

In at least one embodiment according to the first aspect, the image elements whose input transistor forms a distribution current mirror with the distribution transistor are arranged in close proximity to each other.

According to a second aspect of the invention, an array is disclosed. The array may in turn be a subarray of an array.

In at least one embodiment according to the second aspect, the arrangement comprises at least two consecutive diode arrays according to the first aspect. In particular, the arrangement comprises exactly two consecutive diode arrays. By successive diode arrays is meant, for example, directly adjacent diode arrays or diode arrays that are supplied with the same feed line.

One bifurcation transistor and one supply transistor are provided for each image element. The bifurcation transistor forms a supply current mirror with the supply transistor, which is coupled to the diode to supply the diode.

The arrangement further comprises at least one output transistor. The corresponding output transistor is arranged between each two successive diode arrays and forms an output current mirror with the bifurcation transistor of an image element of the first of the two successive diode arrays. The output current mirror is coupled to the distribution transistor for supplying the distribution transistor of a subsequent second of the two successive diode arrays. Further, the distribution transistor of the first of the successive diode arrays is coupled to the feed line and the first supply terminal for supply.

Advantageously, such an arrangement can further reduce the number of feed lines for supplying the individual image elements compared to the diode array according to the first aspect. In particular, the arrangement enables precise referencing of arrays having a plurality of image elements.

Exemplarily, an output current mirror may be associated with each image element. In this case, the reference current supplied to the respective image element can be "inherited" by a single image element or a further diode array according to the first aspect. In particular, the number of feed lines for supplying the individual image elements can thereby be reduced by a factor of between 2, including, up to and including n·m if the image elements are arranged in n columns and m rows are arranged.

In at least one embodiment according to the second aspect, the distribution transistor of the first of the successive diode arrays has its drain electrode coupled to the feed line. In contrast, the distribution transistor of the subsequent diode arrays has its drain electrode coupled to a drain electrode of the output transistor of the preceding diode array. In other words, only the first diode array is directly connected to the feed line, while the subsequent diode arrays are only indirectly coupled to the feed line via the first diode array and possibly other preceding diode arrays.

The distribution transistor of the first or subsequent diode arrays further has its source electrode coupled to the first supply terminal. Furthermore, the distribution transistor has its control electrode coupled to its drain electrode and forms the distribution terminal.

The input transistor has its drain electrode coupled to a drain electrode of the bifurcation transistor. Furthermore, the input transistor has its source electrode coupled to the first supply terminal. Further, the input transistor has its control electrode coupled to the control electrode of the distribution transistor.

The diode arrays each have a second supply terminal. The bifurcation transistor has its source electrode coupled to the second supply terminal. Furthermore, the bifurcation transistor has its control electrode coupled to its drain electrode.

Further, the supply transistor has its drain electrode coupled to a first electrode of the diode. The supply transistor also has its source electrode coupled to the second supply terminal. Further, the supply transistor has its control electrode coupled to the control electrode of the bifurcation transistor.

A second electrode of the diode is coupled to the first supply terminal.

The output transistor has its source electrode coupled to the second supply terminal. Furthermore, the output transistor is coupled with its control electrode to the control electrode of the bifurcation transistor.

The second supply connection is a connection with a different electrical potential than the first supply connection, for example a supply voltage connection. However, the second supply terminal can also denote a ground terminal; in particular, the diode array can be operated in a mirrored operating direction with opposite current direction, in which the n-channel transistors described below are replaced by p-channel transistors and vice versa, and the gate terminals of the current mirrors are designed accordingly.

According to a third aspect of the invention, a further diode array is disclosed. The diode array may in turn be a subarray of an array.

In at least one embodiment according to the third aspect, the diode array comprises at least two successive image elements. In particular, the diode array comprises exactly two successive image elements. By successive image elements is meant, for example, directly adjacent image elements or image elements that are supplied with the same feed line.

The diode array includes a feed line for receiving a reference current and first and second supply terminals.

In addition, a diode, an input current mirror, a bifurcation transistor and a supply transistor are provided for each image element. The bifurcation transistor forms a supply current mirror with the supply transistor. The supply current mirror is coupled to the diode to supply the diode.

The diode array further comprises at least one output transistor. The output transistor is arranged in each case between two successive image elements and forms an output current mirror with the bifurcation transistor of a first of the two successive image elements. In this case, the output current mirror is coupled to the subsequent second image element for supplying the input current mirror of a subsequent second of the two successive image elements.

The input current mirror of the first of the successive image elements is coupled to the feed line and the first supply terminal for supply.

Advantageously, the diode array according to the third aspect enables "inheritance" of a supplied reference current between successive image elements. Advantageously, the number of feed lines for supplying the individual image elements can thus be kept low, and in particular reduced by a factor of between 2 and n·m if the image elements are arranged in n columns and m rows. In particular, the diode array enables precise referencing of arrays with a plurality of image elements.

In at least one embodiment according to the third aspect, the respective input current mirror comprises an input transistor and an output transistor.

The input transistor of the first of the two image elements is coupled with its drain electrode to the feed line. The input transistor of the subsequent image elements is coupled with its drain electrode to a drain electrode of the output transistor of the previous image element.

The input transistor of the first or subsequent image elements is further coupled with its source electrode to the first supply terminal. Furthermore, the input transistor has its control electrode coupled to its drain electrode.

The output transistor has its drain electrode coupled to a drain electrode of the bifurcation transistor. Further, the output transistor has its source electrode coupled to the first supply terminal. Furthermore, the output transistor has its control electrode coupled to the control electrode of the input transistor.

The diode arrays each have a second supply terminal. The bifurcation transistor has its source electrode coupled to the second supply terminal. Furthermore, the bifurcation transistor has its control electrode coupled to its drain electrode.

The supply transistor has its drain electrode coupled to a first electrode of the diode. Further, the supply transistor has its source electrode coupled to the second supply terminal. Further, the supply transistor has its control electrode coupled to the control electrode of the bifurcation transistor.

A second electrode of the diode is further coupled to the first supply terminal.

The output transistor has its source electrode coupled to the second supply terminal. Furthermore, the output transistor is coupled with its control electrode to the control electrode of the bifurcation transistor.

According to a fourth aspect of the invention, an array is disclosed. The array is, for example, an LED array or a photodiode array.

In at least one embodiment according to the fourth aspect, the array comprises a plurality of image elements. In particular, the array comprises more than 10, preferably more than 100, more preferably more than 1000 image elements.

The image elements are at least partially arranged in at least one diode array according to the first aspect. In this case, the diode array has a respective feed line, in particular for supplying the respective distribution transistor.

Alternatively or additionally, the image elements are at least partially arranged in at least one arrangement according to the second aspect. In this case, the arrangement has a respective feed line, in particular for supplying the respective distribution transistor of the first of the successive diode arrays.

Alternatively or additionally, the image elements are at least partially arranged in at least one diode array according to the third aspect. In this case, the diode array has a respective feed line, in particular for supplying the respective input current mirror of the first of the successive image elements.

In particular, the image elements of the array may also be arranged in a combination of the diode arrays according to the first and third aspects or the arrangement according to the second aspect.

In at least one embodiment according to the fourth aspect, the image elements of the array are arranged in a matrix-like manner in n columns and m rows. In the array, between and including one and including $$\frac{m}{2}$$

feed lines are provided.

In at least one embodiment according to the fourth aspect, the image elements of the array are arranged in a matrix-like manner in n columns and m rows. In the array, between including one and including $$\frac{n}{2}$$

feed lines are provided.

In at least one embodiment according to the fourth aspect, the distribution transistor forms with the respective input transistor of exactly f image elements forms a distribution current mirror.

The image elements of the array are arranged matrix-like in n columns and m rows. In the array, between including $$\frac{n \cdot m}{f}$$

and including $$\frac{n \cdot m}{f^2}$$

feed lines are provided. In particular, the array is provided with $$\frac{n \cdot m}{8}$$

feed lines.

In at least one embodiment according to the fourth aspect, the distribution transistor forms with the respective input transistor of exactly $f_1$ image elements a distribution current mirror, wherein exactly $f_2$ image elements are each indirectly or directly associated with an output transistor for above-mentioned "inheritance".

The image elements of the array are arranged matrix-like in n columns and m rows. The array then has exactly $$\frac{n \cdot m}{f_1 \cdot f_2}$$

feed lines are provided.

In at least one embodiment according to the fourth aspect, the distribution current mirror and/or the supply current mirror and/or the output current mirror has a common-centroid layout.

According to a fifth aspect of the invention, a system is disclosed.

In at least one embodiment according to the fifth aspect, the system comprises an array according to the fourth aspect and a reference current source.

The reference current source has one output line for each feed line of the array. The respective output line is coupled to the corresponding feed line.

In at least one embodiment according to the fifth aspect, the reference current source comprises a current mirror bank. The current mirror bank has an input for supplying a reference current and an output line for each feed line of the array.

Thereby, the current mirror bank is arranged to provide the reference current supplied at the input on the corresponding output lines, in particular for supplying the respective distribution transistor or the respective input current mirror.

According to a sixth aspect of the invention, a headlight for a motor vehicle is disclosed. In particular, the headlight may be a front, or rear, light of the motor vehicle. The headlight comprises an LED array according to the fourth aspect and/or a system according to the fifth aspect.

Further advantages, advantageous embodiments and further embodiments result from the embodiment examples described below in connection with the figures.

Figure 1:
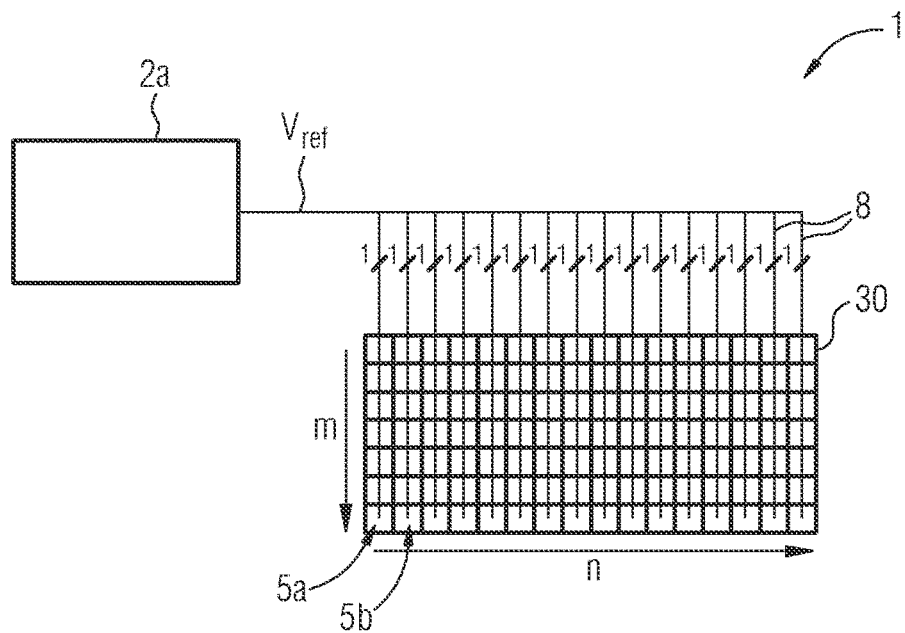
Figure 2B:
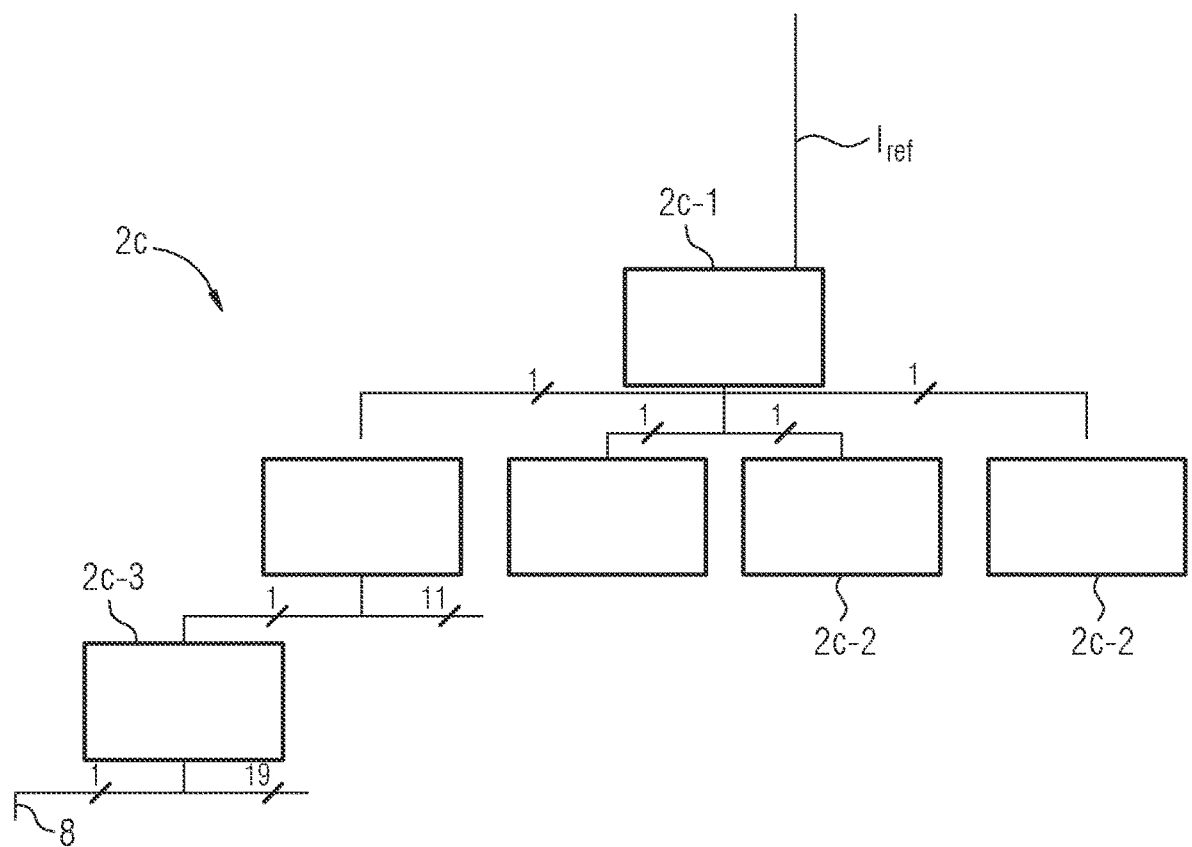
Figure 3A:
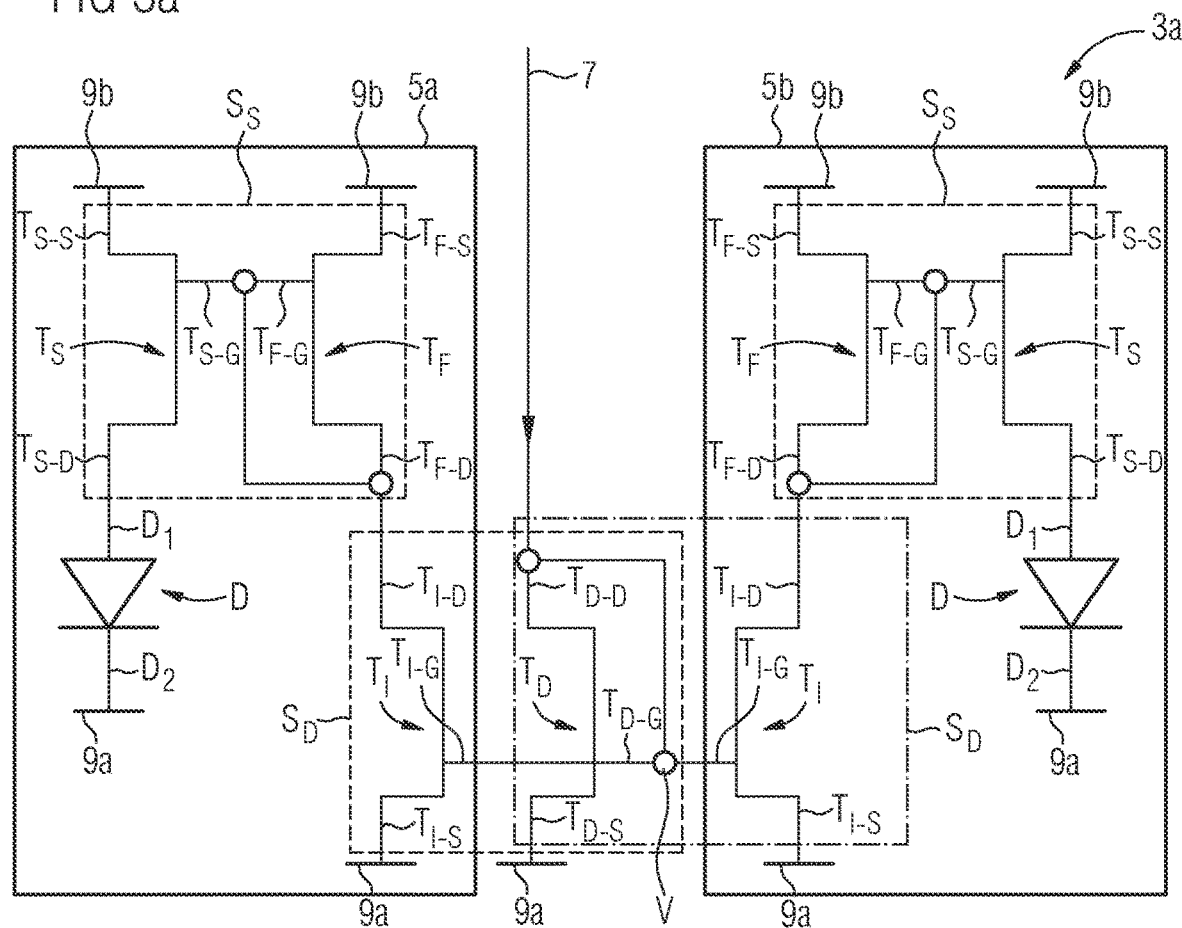
Figure 3B:
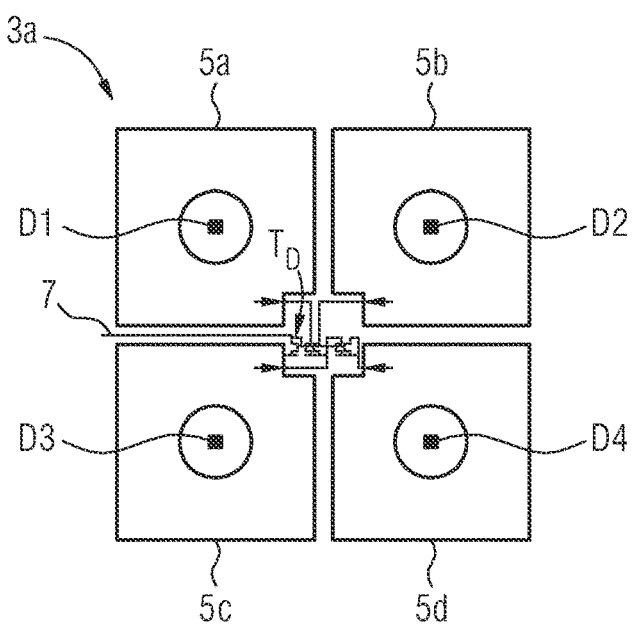
Figure 4:
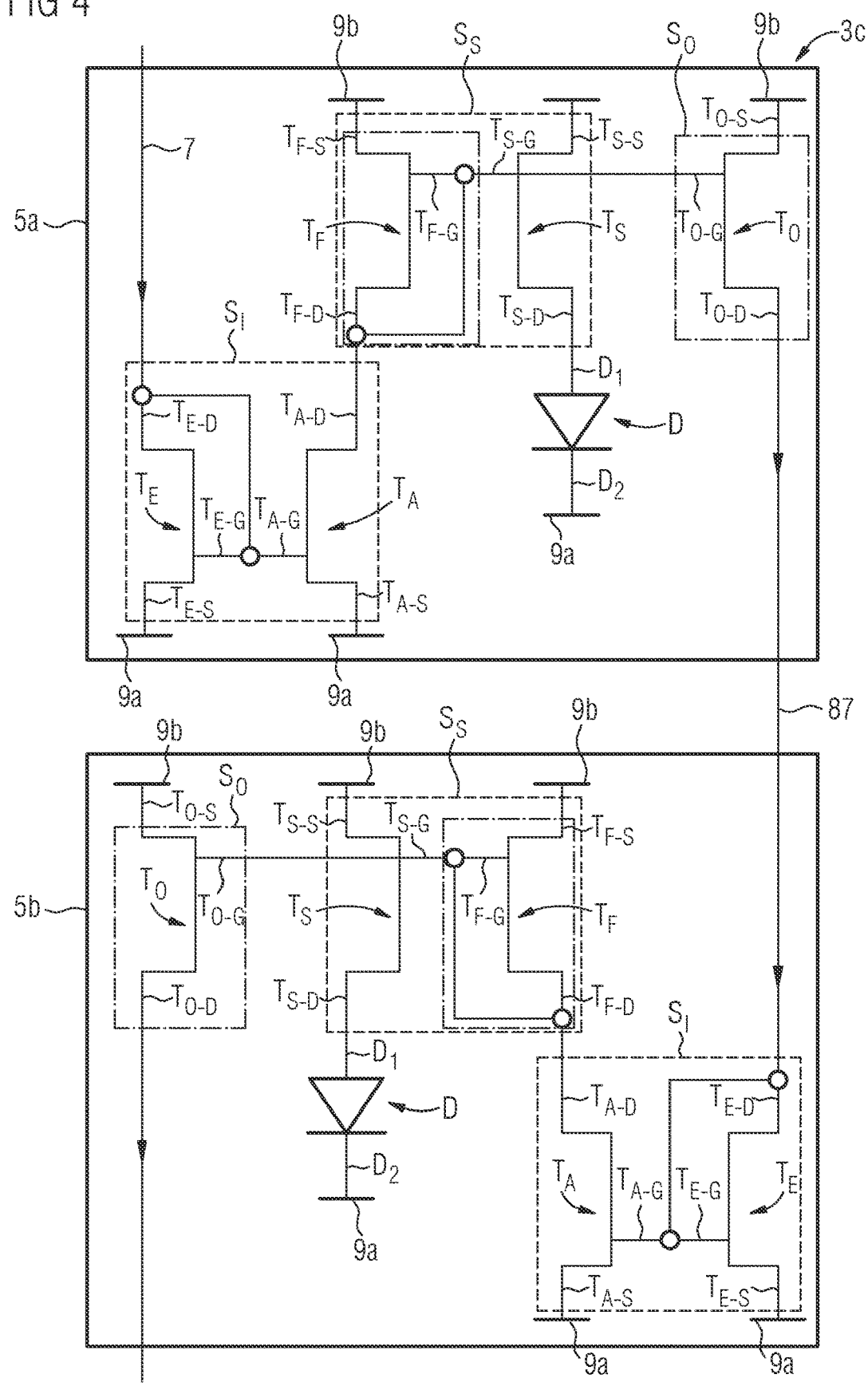
Figure 6:
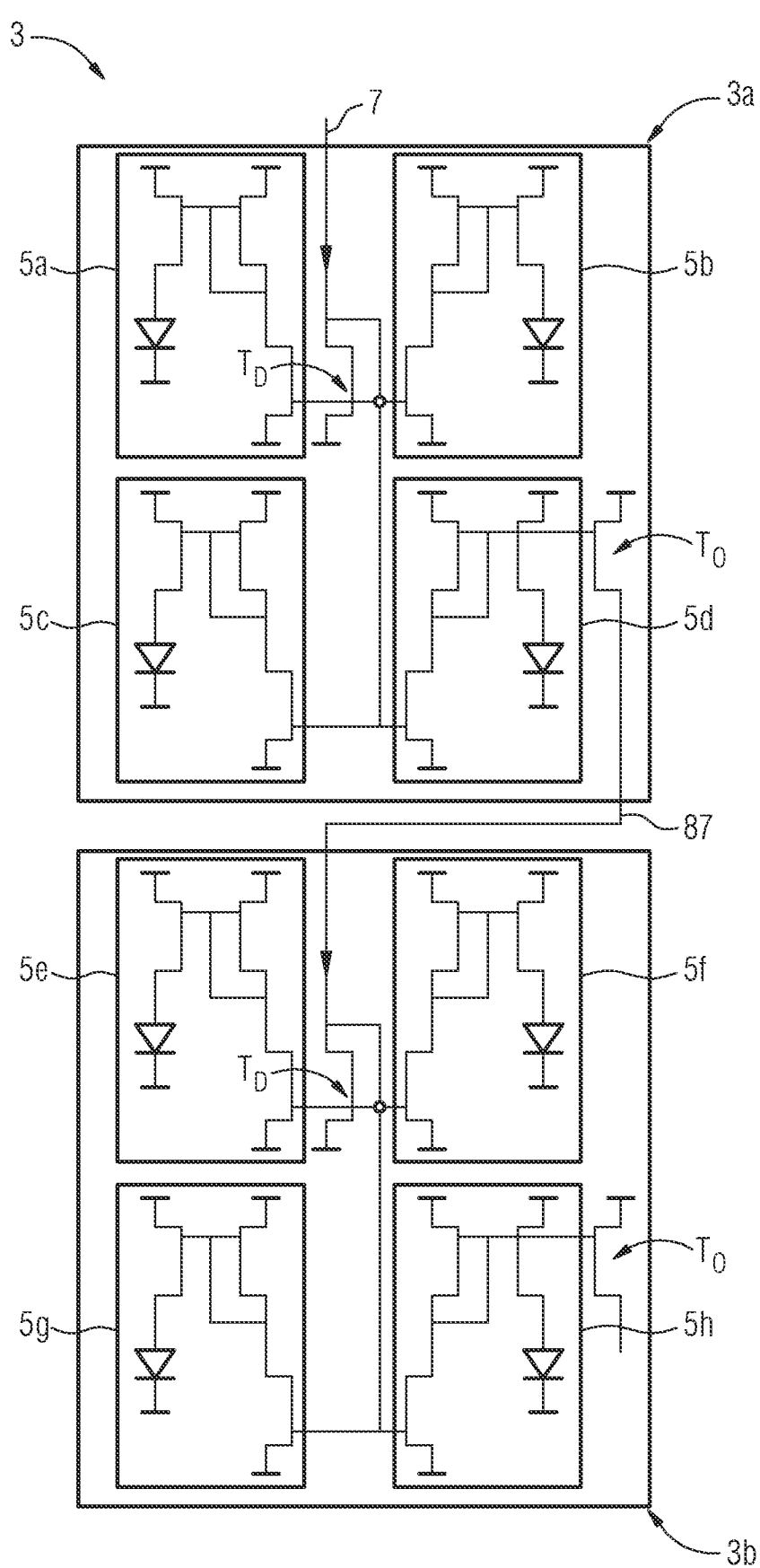

It show:

FIG. 1 a voltage referenced array and its wiring,

FIG. 2a a current referenced array and its wiring,

FIG. 2b a schematic representation of a cascaded current mirror bank for current referencing according to FIG. 2a, FIG. 3a a first embodiment of a diode array for use in the system shown in FIG. 2a, FIG. 3b is a top view of a second embodiment of a diode array for use in the system shown in FIG. 2a, FIG. 4 a third embodiment of a diode array for use in the system shown in FIG. 2a, FIG. 5a a first embodiment of a wiring of the diode array shown in FIG. 4 in the system shown in FIG. 2a, FIG. 5b a second embodiment of a wiring of the diode array shown in FIG. 4 in the system shown in FIG. 2a, and FIG. 6 shows a fourth embodiment of two consecutive diode arrays for use in the system shown in FIG. 2a.

Elements that are identical, similar or have the same effect are given the same reference signs in the figures. The figures and the proportions of the elements shown in the figures are not to be regarded as to scale. Rather, individual elements may be shown exaggeratedly large for better representability and/or for better comprehensibility. Dashed outlines indicate a functional unit of the elements arranged therein.

In arrays such as LED arrays or in image sensors, active circuit parts are often used within an image element. The image elements usually require high-precision references, i.e. reference currents or voltages. The reference can, for example, refer to a bandgap of a pn junction; ideally, the same reference is available to each image element. However, reference generation within the image elements makes uniform referencing (so-called "matching") across all image elements of the array difficult.

FIG. 1 shows a system 1' for supplying an external reference voltage $V_{ref}$ to an LED array 30. The LED array has n columns and m rows of image elements 5a, 5b arranged in a matrix, each column being coupled to an output line 8 of a bandgap reference 2a for supplying the corresponding image elements 5a, 5b. Thus, only one output line 8 is required per column. However, the system 1' may be subjected to several error influences in the process, such as a mismatch of transistors installed in the respective image elements as current sources. Temperature differences, local ground or supply differences also strongly influence the system 1'.

To avoid these error effects, current-based referencing is preferable. FIG. 2a shows a system 1 for supplying the LED array 30 with an external reference current $I_{ref}$, in which each image element 5a, 5b is coupled to an output line 8 of a reference current source 20. For this purpose, the bandgap reference 2a is coupled to an operational amplifier with a downstream resistor as a voltage-to-current converter 2b as well as a current mirror bank 2c. Since the reference current $I_{ref}$ is independent of local supply voltage levels, and transistors of the current mirror bank are each locally adjacent, this variant is less susceptible to the above-mentioned sources of error, but requires a great deal of wiring. Especially in arrays 30 with a large number of image elements 5a, 5b of small size (for example <40 µm, in particular ≤10 µm), the space for feed lines for the individual image elements 5a, 5b is limited.

FIG. 3a shows a first embodiment of a diode array 3a for use as a subarray in the system 1 shown in FIG. 2a, which helps to keep the wiring effort low and at the same time enables highly accurate referencing of the image elements 5a, 5b.

In this embodiment, the diode array 3a shown comprises two adjacent image elements 5a, 5b of the array 30. In other embodiments, the diode array 3a may also comprise more than two adjacent image elements 5a, 5b, in particular four, eight or sixteen. For both image elements 5a, 5b, the diode array 3a has only a single feed line 7, which is to be coupled to the output line 8 of the reference current source 20 for supplying the image elements 5a, 5b. On the input side, the diode array 3a has a distribution transistor $T_D$ whose drain electrode $T_{D-D}$ is connected to the feed line 7 for receiving the reference current $I_{ref}$. A control electrode $T_{D-G}$ of the distribution transistor $T_D$ is connected to the drain electrode $T_{D-D}$ to form a distribution terminal V for the image elements 5a, 5b of the diode array 3a. Finally, a source electrode $T_{D-S}$ of the distribution transistor $_{TD}$ is connected to a ground terminal 9a of the array 30. A supply voltage terminal may also fall under the ground terminal 9a; in this context, the diode array 3a may be operated in the opposite current direction complementary to this embodiment, in which the n-channel MOSFETs described below are replaced by p-channel MOSFETs and vice versa.

The two image elements 5a, 5b each have an input transistor $T_I$ on the input side, the control electrode $T_{I-G}$ of which is connected to the distribution terminal V. A source electrode of the input transistor $T_I$ is in turn connected to the ground terminal 9a of the array 30. On the output side, the input transistor $T_I$ essentially provides the reference current $I_{ref}$ supplied to the diode array 3a via the feed line 7 through its drain electrode $T_{D-D}$ by this interconnection. The distribution transistor $T_D$ thus forms a current mirror with the respective input transistor $T_I$ of the two image elements 5a, 5b in each case, which is referred to below as the distribution current mirror $S_D$ and is indicated by the dashed or dash-dotted box in FIG. 3a.

The reference current $I_{ref}$ provided on the output side with respect to the distribution current mirror $S_D$ is supplied to a respective diode D associated with the corresponding image element 5a, 5b via its first electrode $D_1$. A second electrode $D_2$ of the diode D is connected to the ground terminal 9a.

In this embodiment, a supply current mirror $_{SS}$ is connected downstream of the distribution current mirror $_{SD\ for}$ each image element 5a, 5b, via which the reference current $I_{ref}$ is supplied to the corresponding diode D. The supply current mirror $_{SS}$ comprises a bifurcation transistor $_{TF}$ on the input side and a supply transistor $T_S$ on the output side, which are each connected with their source electrodes $T_{F-S}$, $T_{S-S}$ to a supply voltage terminal 9b. Here, the transistors $T_D$, $T_I$ associated with the distribution current mirror $S_D$ are n-channel MOSFETs and the transistors $T_F$, $T_S$ associated with the supply current mirror $S_S$ are p-channel MOSFETs. In other embodiments, the distribution current mirror $_{SD}$ per image element 5a, 5b may also be directly connected to the first electrode $D_2$ of the corresponding diode D, the second electrode $D_2$ of which is then connected to the supply voltage terminal 9b. By way of example, the transistors $T_D$, $T_I$ associated with the distribution current mirror $_{SD}$ are then designed as p-channel MOSFETs.

The transistors $T_D$, $T_I$, $T_F$, $T_S$ assigned to the respective current mirrors $S_D$, $S_S$ can in particular be arranged locally close to each other in order to keep a mismatch error low. Preferably, the transistors $T_D$, $T_I$, $T_F$, $T_S$ assigned to the respective current mirrors $S_D$, $S_S$ are formed according to the common-centroid layout, for example to compensate for a gradient in the gate oxide. In this regard, reference is made to the statements of Daniel Payne in "A Review of an Analog Layout Tool called HiPer DevGen" and Nurahmad Omar in "Automated Layout Synthesis Tool for Op-Amp", the disclosure content of which is hereby incorporated by reference in its entirety.

In particular, the layout of the individual image elements 5a, 5b can be mirrored as shown in FIG. 3b. In this second embodiment, the distribution transistor $T_D$ is arranged centrally with respect to four image elements 5a, 5b, 5c, 5d arranged in a matrix, each with an LED D1, D2, D3, D4, wherein an arrangement of the individual components of the image elements 5a, 5b, 5c, 5d is respectively mirrored with respect to a vertical axis along a column of the matrix by the distribution transistor $T_D$ and with respect to a horizontal axis along a row of the matrix by the distribution transistor $T_D$.

The structure of the diode array 3a shown in the embodiments of FIGS. 3a and 3b can also be referred to as "input sharing" and does not introduce any additional mismatch error. The number of feed lines 7 for wiring the image elements 5a, 5b, 5c, 5d can be reduced by a factor of f where f corresponds to the number of image elements 5a, 5b, 5c, 5d each assigned to a distribution transistor $T_D$.

FIG. 4 shows a third embodiment of a diode array 3c for use as a subarray in the system 1 shown in FIG. 2a, which also helps to keep wiring costs low while enabling highly accurate referencing of the image elements 5a, 5b.

The diode array 3c differs from the diode array 3a in, among other things, that no central distribution transistor $T_D$ is arranged between the image elements 5a, 5b. Instead, a feed line 7 of the diode array 3c is directly connected to a first image element 5a for coupling to an output line 8 of the reference current source 20. The first image element 5a is thereby connected on the output side via an inheritance line 87 to a subsequent second image element 5b.

The individual image elements 5a, 5b are assigned an input current mirror $_{SI\ for}$ this purpose, to which a corresponding current is supplied via the feed line 7 or the inheritance line 87. The first image element 5a is furthermore assigned an output transistor $T_O$ for this purpose, to which the input current mirror $S_I$ of the second image element 5b is connected via the inheritance line 87. In the embodiment shown, the second image element 5b is also assigned an output transistor $_{TO}$ for supplying subsequent image elements, which can be dispensed with in other embodiments.

The input current mirror $S_I$ has an input transistor $T_E$ and an output transistor $T_A$, which together are arranged to provide the reference current $I_{ref}$ supplied via the feed line 7 at a drain electrode $T_{E-D}$ of the input transistor $T_E$ on the output side at a drain electrode $T_{A-D}$ of the output transistor $T_A$.

Analogous to the first embodiment, the individual image elements 5a, 5b furthermore have a supply current mirror $S_S$ connected downstream of the input current mirror $S_S$, via which the reference current $I_{ref}$ is fed to the corresponding diode D. In addition, however, the bifurcation transistor $T_F$ has its control electrode $T_{E-G}$ connected to a control electrode $R_{F-G}$ of the output transistor $T_O$ and forms an output current mirror $S_O$ with the latter (indicated by the two boxes with dash dots). The output current mirror so is arranged to provide the reference current $I_{ref}$ supplied via the drain electrode $T_{A-D}$ of the output transistor $T_A$ of the input current mirror $S_I$ to a drain electrode $T_{F-D}$ of the bifurcation transistor $T_F$ on the output side at a drain electrode $T_{o-D}$ of the output transistor $T_o$.

In the third embodiment, the transistors $T_E$, $T_A$ associated with the input current mirror si are n-channel MOSFETs and the transistors $T_F$, $T_S$, $T_O$ associated with the supply current mirror $S_S$ and the output current mirror $S_O$, respectively, are p-channel MOSFETs. In other embodiments, instead of driving the diodes D on the anode side, if the diodes D are each arranged "rotated" and the ground terminal 9a is designed as a supply voltage terminal and the supply voltage terminal 9b is designed as a ground terminal, for example, current for driving the respective diode D can be drawn from the cathode with a corresponding "low side" driver. In this case, the transistors $T_E$, $T_A$ are p-channel MOSFETs and the transistors $T_F$, $T_S$, $T_O$ are n-channel MOSFETs.

In an advantageous manner, a number of output lines 8 for supplying the diode array 3c can thus be kept low. The reference current $I_{ref}$ arriving via the feed line 7 is first mirrored (here from n to p) and then mirrored in parallel into the load and via an additional mirror transistor into the next image element. In extreme cases, a single reference line can thus be used to mirror an entire column (or row) of m (resp. n) image elements can be served. The mismatch error of the then used m (resp. n) mirrors then used spreads out to the last image element, however, in particular a convolution of the static distribution takes place in each mirror, hence the "Gaussian" widens out. As shown in FIGS. 5a and 5b, respectively, a compromise between number of lines and accuracy has to be made. FIG. 5a shows a first embodiment of a wiring of the diode array 3c shown in FIG. 4 in the system 1 according to FIG. 2a, where one output line 8 supplies all image elements of a column. In a second embodiment (FIG. 5b), on the other hand, only two successive image elements are supplied with an output line 8.

The compromise solution to be selected can be made dependent in particular on the available space.

Finally, on the basis of FIG. 6, a fourth embodiment example is shown which combines the approaches shown in the preceding embodiment examples. Here, two successive diode arrays 3a, 3b are interconnected in an arrangement 3 for use as a subarray in the system 1 shown in FIG. 2a.

A distribution transistor $T_D$ is assigned to the first diode array 3a, which is connected to the feed line 7 and, analogously to the first and second embodiment examples, supplies the surrounding image elements 5a, 5b, 5c, 5d with the reference current $I_{ref}$ applied to the feed line 7. In this embodiment, only the image element 5d has an output transistor $T_O$ associated therewith, which is connected via an inheritance line 87 to the distribution transistor $T_D$ of the subsequent second diode array 3b. In other embodiments, a corresponding output transistor $T_O$ may also be assigned to more than one image element 5d, in particular to all image elements 5a, 5b, 5c, 5d, and the arrangement 3 may comprise correspondingly more image elements which are supplied by the same feed line 7. Analogously to the first and second embodiment examples, the image elements 5e, 5f, 5g, 5h located around the distribution transistor $T_D$ of the second diode array 3b are supplied with the reference current $I_{ref}$ applied to the inheritance line 87.

The inheritance of the reference current $I_{ref}$ of an image element to an adjacent image element as well as the local sharing of an input current mirror transistor with adjacent image elements ("input sharing") can be combined and scaled as shown in the fourth embodiment. Advantageously, this enables high-precision referencing, reduced wiring effort, or wiring of larger arrays at all, with comparatively low hardware effort.

The invention is not limited to these by the description based on the embodiments. Rather, the invention encompasses any new feature as well as any combination of features, which in particular includes any combination of features in the patent claims, even if this feature or combination itself is not explicitly stated in the patent claims or embodiments.

LIST OF REFERENCE SIGNS

1', 1 System
2a Reference voltage source
2b Voltage-to-current converter
2c, 2c-1, 2c-2, 2c-3 Current mirror bench
20 Reference current source
3 Arrangement
3a, 3b, 3c Diode array
30 Array
5a, 5b, 5c, 5d, 5e, 5f, 5g, 5h Image element
7 Feed line
8 Output line
87 Inheritance line
9a, 9b Supply connection
D, D1, D2, D3, D4 Diode
$D_1$, $D_2$ Electrode
$S_D$ Distribution current mirror
$S_I$ Input current mirror
$S_S$ Supply current level
$S_O$ Output current level
$T_D$ T Distribution transistor
$T_I$ Input transistor
$T_F$ Forking transistor
$T_S$ Supply transistor
$T_O$ Output transistor
$T_E$ Input transistor
$T_A$ Output transistor
$T_{D\text{-}D}$, $T_{I\text{-}D}$, $T_{F\text{-}D}$, $T_{S\text{-}D}$, $T_{O\text{-}D}$, $T_{E\text{-}D}$, $T_{A\text{-}D}$ Drain electrode
$T_{D\text{-}S}$, $T_{I\text{-}S}$, $T_{F\text{-}S}$, $T_{S\text{-}S}$, $T_{O\text{-}S}$, $T_{E\text{-}S}$, $T_{A\text{-}S}$ Source electrode
$T_{D\text{-}G}$, $T_{I\text{-}G}$, $T_{F\text{-}G}$, $T_{S\text{-}G}$, $T_{O\text{-}G}$, $T_{F\text{-}G}$, $T_{A\text{-}G}$ Control electrode
$V_{ref}$ Reference voltage
$I_{ref}$ Reference current

The invention claimed is:

1. A diode array with at least two successive image elements, wherein
the diode array comprises a feed line for receiving a reference current and a first and a second supply terminal,
a diode, an input current mirror, a bifurcation transistor and a supply transistor are provided for each image element, the bifurcation transistor forming with the supply transistor a supply current mirror which is coupled to the diode in order to supply the diode,
the diode array comprises at least one output transistor disposed between two successive image elements and forming, with the bifurcation transistor of a first of the two successive image elements, an output current mirror coupled to the input current mirror of a successive second of the two successive image elements for supplying said input current mirror, wherein
for supplying the input current mirror of the first of the successive image elements, said input current mirror is coupled to the feed line and to the first supply terminal.

2. The diode array according to claim 1, in which
the respective input current mirror comprises an input transistor and an output transistor, wherein
the input transistor of the first of the two image elements is coupled via its drain electrode to the feed line, and the input transistor of subsequent image elements is coupled via its drain electrode to a drain electrode of the output transistor of a preceding image element,
the input transistor of the first or the subsequent image elements is coupled via its source electrode to the first supply terminal and via its control electrode to its drain electrode,
the output transistor is coupled via its drain electrode to a drain electrode of the bifurcation transistor, via its source electrode to the first supply terminal, and via its control electrode to the control electrode of the input transistor,
the bifurcation transistor is coupled via its source electrode to the second supply terminal and via its control electrode to its drain electrode, the supply transistor is coupled via its drain electrode to a first electrode of the diode, via its source electrode to the second supply terminal and via its control electrode to the control electrode of the bifurcation transistor, a second electrode of the diode is coupled to the first supply terminal, and the output transistor is coupled via its source electrode to the second supply terminal and via its control electrode to the control electrode of the bifurcation transistor.

3. An array comprising a plurality of image elements, wherein the image elements are arranged at least partially in at least one diode array according to claim 1, wherein the at least one diode array comprises a respective feed line.

* * * * *